US012621940B2

(12) United States Patent
Kinder et al.

(10) Patent No.: US 12,621,940 B2
(45) Date of Patent: May 5, 2026

(54) MULTILAYER VENT ASSEMBLY

(71) Applicant: W. L. Gore & Associates, Inc., Newark, DE (US)

(72) Inventors: William Kinder, Newark, DE (US); Scott Zero, Newark, DE (US)

(73) Assignee: W. L. Gore & Associates, Inc., Newark, DE (US)

( * ) Notice: Subject to any disclaimer, the term of this patent is extended or adjusted under 35 U.S.C. 154(b) by 0 days.

(21) Appl. No.: 19/291,718

(22) Filed: Aug. 6, 2025

(65) Prior Publication Data

US 2026/0047015 A1      Feb. 12, 2026

Related U.S. Application Data

(60) Provisional application No. 63/680,129, filed on Aug. 7, 2024.

(51) Int. Cl.
B01D 53/02 (2006.01)
H05K 5/02 (2006.01)
(52) U.S. Cl.
CPC .................................. H05K 5/0215 (2022.08)
(58) Field of Classification Search
CPC ................................................... H05K 5/0215
See application file for complete search history.

(56) References Cited

U.S. PATENT DOCUMENTS

| | | | | |
|---|---|---|---|---|
| 5,417,743 A | * | 5/1995 | Dauber | B01D 53/22 |
| | | | | 360/99.15 |
| 6,030,428 A | * | 2/2000 | Ishino | B01D 39/1692 |
| | | | | 55/528 |
| 10,010,822 B2 | * | 7/2018 | Miller, III | B03C 3/28 |
| 10,173,174 B2 | * | 1/2019 | Jessen | B01D 61/50 |
| 10,482,928 B2 | * | 11/2019 | Miller, III | G11B 33/146 |
| 2007/0184238 A1 | * | 8/2007 | Hockaday | F04B 39/1073 |
| | | | | 428/98 |
| 2016/0167948 A1 | * | 6/2016 | Holliday | B32B 27/288 |
| | | | | 428/212 |
| 2018/0299997 A1 | * | 10/2018 | Isaacson | G06F 3/045 |
| 2020/0382858 A1 | | 12/2020 | Boluriaan et al. | |
| 2021/0092499 A1 | | 3/2021 | Fukushima et al. | |
| 2023/0137568 A1 | * | 5/2023 | Peet | A61F 5/445 |
| | | | | 604/332 |
| 2024/0306323 A1 | * | 9/2024 | Minami | H05K 5/0214 |

OTHER PUBLICATIONS

International Search Report and Written Opinion received for PCT Patent Application No. PCT/US2025/040818, mailed on Oct. 15, 2025, 15 pages.

* cited by examiner

*Primary Examiner* — Christopher P Jones

(57) ABSTRACT

A vent assembly include a membrane stack, the membrane stack including a plurality of membranes and an air gap between adjacent membranes in the plurality of membranes, wherein each membrane in the plurality of membranes includes a non-fluoropolymer and substantially occlude each other in the membrane stack.

24 Claims, 5 Drawing Sheets

MULTILAYER VENT ASSEMBLY

CROSS-REFERENCE TO RELATED APPLICATION

This application claims priority to U.S. Provisional Application No. 63/680,129, filed Aug. 7, 2024, which is hereby incorporated herein by reference in its entirety for all purposes.

FIELD

The present disclosure relates to vent assemblies for use with devices, especially to vent assemblies for use with electronic devices, and devices, especially electronic devices, comprising the same.

BACKGROUND

Electronic devices that comprise acoustic transducers such as speakers and microphones often comprise vents or vent assemblies that protect such acoustic transducers from the contact with contaminants such as particulates or liquids. Such vents or vent assemblies typically occlude an aperture in the housing of the electronic device through which sound travels from or to the speaker or microphone respectively. Additionally, electronic devices also often incorporate pressure vents, which provide similar functionality in that they prevent the ingress of particulates and liquids from entering and damaging sensitive components but are not necessarily required to transmit sound.

The materials used to make up the vents or vent assemblies are required to be resistant to the passage of particulates and liquids, especially liquid water, whilst also maximising the transmission of sound through them.

Typically, in order to ensure that the interior of the electronic device is adequately protected from particulates and liquids in a manner that is robust to typical device usage, the membrane of the vent or vent assembly is tailored to prevent ingress of particulates and liquids whilst trying to minimise the degradation of these protection properties after the vent assembly is challenged with high water pressure (such as may happen with accidental submersion of the device) or chemical contamination (such as may happen if the device comes into contact with soapy water, e.g.).

However, the properties of new electronic devices are required to constantly be improving by the expectations of users whilst also ensuring that these electronic devices become more durable and resistant to damage due to ingress of liquids and particulates.

Accordingly, there remains a need for improved vents and vent assemblies that have improved performance, including performance that does not degrade when the vent and vent assemblies are challenged.

Furthermore, vents and vent assemblies often use fluoropolymer membranes which belong to a class of materials known as per- or poly-fluoroalkyl substances (PFAS). PFAS materials may provide superior performance, but may be subject to use restrictions as a result of pending legislation in various jurisdictions that may preclude their use in such applications.

Accordingly, it is desirable to provide vents and vent assemblies that do not incorporate fluoropolymer membranes and that have comparable performance.

The present disclosure is intended at least in part to address at least one of these issues.

SUMMARY

According to a first aspect there is provided a vent assembly comprising a membrane stack, the membrane stack comprising a plurality of membranes and an air gap between adjacent membranes in the plurality of membranes, wherein each membrane in the plurality of membranes comprises a non-fluoropolymer and substantially occlude each other in the membrane stack.

Typically, each membrane in the plurality of membranes is resistant to deformation during a water challenge. The air gap between adjacent membranes in the plurality of membranes may be maintained or substantially maintained during use. Accordingly, each membrane in the plurality of membranes may not be deformed or otherwise moved to contact or touch an adjacent membrane.

The thickness of each membrane in the plurality of membranes may be at least 5 μm. The thickness of each membrane in the plurality of membranes may be at least 7 μm. The thickness of each membrane in the plurality of membranes may be at least 10 μm. The thickness of each membrane in the plurality of membranes may be at least 15 μm.

The thickness of each membrane in the plurality of membranes may be from 5 μm to 200 μm. The thickness of each membrane in the plurality of membranes may be from 5 μm to 150 μm. The thickness of each membrane in the plurality of membranes may be from 5 μm to 100 μm. The thickness of each membrane in the plurality of membranes may be from 7 μm to 200 μm. The thickness of each membrane in the plurality of membranes may be from 7 μm to 150 μm. The thickness of each membrane in the plurality of membranes may be from 7 μm to 100 μm. The thickness of each membrane in the plurality of membranes may be from 10 μm to 200 μm. The thickness of each membrane in the plurality of membranes may be from 10 μm to 150 μm. The thickness of each membrane in the plurality of membranes may be from 10 μm to 100 μm. The thickness of each membrane in the plurality of membranes may be from 15 μm to 200 μm. The thickness of each membrane in the plurality of membranes may be from 15 μm to 150 μm. The thickness of each membrane in the plurality of membranes may be from 15 μm to 100 μm. The thickness of each membrane in the plurality of membranes may be from 5 μm to 90 μm. The thickness of each membrane in the plurality of membranes may be from 5 μm to 80 μm. The thickness of each membrane in the plurality of membranes may be from 5 μm to 70 μm. The thickness of each membrane in the plurality of membranes may be from 5 μm to 60 μm. The thickness of each membrane in the plurality of membranes may be from 5 μm to 50 μm.

The air gap between adjacent membranes may be at least 20 μm. Accordingly, the distance between adjacent surfaces of adjacent membranes in the membrane stack may be at least 20 μm. In the membrane stack, membrane layers may be separated by intervening layers of material, for example an adhesive, and regions of the membrane adjacent to the intervening layers of material may not be in contact with the intervening material The air gap may be defined as the membrane separation distance at the edge of the intervening material, such that the thickness of the air gap is defined by the thickness of the of intervening material. The membrane separation distance at points away from the edge of the adhesive may vary but may typically be of similar or near identical scale to the air gap.

The air gap between adjacent membranes may be at least 25 μm. The air gap between adjacent membranes may be at least 30 μm.

The air gap between adjacent membranes may be from 20 μm to 100 μm. The air gap between adjacent membranes may be from 25 μm to 100 μm. The air gap between adjacent membranes may be from 30 μm to 100 μm. The air gap between adjacent membranes may be from 20 μm to 90 μm. The air gap between adjacent membranes may be from 20 μm to 80 μm. The air gap between adjacent membranes may be from 20 μm to 70 μm. The air gap between adjacent membranes may be from 20 μm to 60 μm. The air gap between adjacent membranes may be from 20 μm to 50 μm.

Each membrane in the plurality of membranes may have a mass per area of at least $2.0 \text{ g/m}^2$. Each membrane in the plurality of membranes may have a mass per area of at least $2.5 \text{ g/m}^2$. Each membrane in the plurality of membranes may have a mass per area of at least $3.0 \text{ g/m}^2$. Each membrane in the plurality of membranes may have a mass per area of from $2.0 \text{ g/m}^2$ to $100 \text{ g/m}^2$. Each membrane in the plurality of membranes may have a mass per area of from $2.0 \text{ g/m}^2$ to $95 \text{ g/m}^2$. Each membrane in the plurality of membranes may have a mass per area of from $2.0 \text{ g/m}^2$ to $90 \text{ g/m}^2$. Each membrane in the plurality of membranes may have a mass per area of from $2.0 \text{ g/m}^2$ to $85 \text{ g/m}^2$. Each membrane in the plurality of membranes may have a mass per area of from $2.0 \text{ g/m}^2$ to $80 \text{ g/m}^2$. Each membrane in the plurality of membranes may have a mass per area of from $2.0 \text{ g/m}^2$ to $75 \text{ g/m}^2$. Each membrane in the plurality of membranes may have a mass per area of from $2.0 \text{ g/m}^2$ to $70 \text{ g/m}^2$. Each membrane in the plurality of membranes may have a mass per area of from $2.0 \text{ g/m}^2$ to $65 \text{ g/m}^2$. Each membrane in the plurality of membranes may have a mass per area of from $2.0 \text{ g/m}^2$ to $60 \text{ g/m}^2$. Each membrane in the plurality of membranes may have a mass per area of from $2.0 \text{ g/m}^2$ to $55 \text{ g/m}^2$. Each membrane in the plurality of membranes may have a mass per area of from $2.0 \text{ g/m}^2$ to $50 \text{ g/m}^2$. Each membrane in the plurality of membranes may have a mass per area of from $2.0 \text{ g/m}^2$ to $45 \text{ g/m}^2$. Each membrane in the plurality of membranes may have a mass per area of from $2.0 \text{ g/m}^2$ to $40 \text{ g/m}^2$. Each membrane in the plurality of membranes may have a mass per area of from $2.0 \text{ g/m}^2$ to $35 \text{ g/m}^2$. Each membrane in the plurality of membranes may have a mass per area of from $2.0 \text{ g/m}^2$ to $30 \text{ g/m}^2$. Each membrane in the plurality of membranes may have a mass per area of from $2.0 \text{ g/m}^2$ to $25 \text{ g/m}^2$. Each membrane in the plurality of membranes may have a mass per area of from $2.5 \text{ g/m}^2$ to $100 \text{ g/m}^2$. Each membrane in the plurality of membranes may have a mass per area of from $2.5 \text{ g/m}^2$ to $95 \text{ g/m}^2$. Each membrane in the plurality of membranes may have a mass per area of from $2.5 \text{ g/m}^2$ to $90 \text{ g/m}^2$. Each membrane in the plurality of membranes may have a mass per area of from $2.5 \text{ g/m}^2$ to $85 \text{ g/m}^2$. Each membrane in the plurality of membranes may have a mass per area of from $2.5 \text{ g/m}^2$ to $80 \text{ g/m}^2$. Each membrane in the plurality of membranes may have a mass per area of from $2.5 \text{ g/m}^2$ to $75 \text{ g/m}^2$. Each membrane in the plurality of membranes may have a mass per area of from $2.5 \text{ g/m}^2$ to $70 \text{ g/m}^2$. Each membrane in the plurality of membranes may have a mass per area of from $2.5 \text{ g/m}^2$ to $65 \text{ g/m}^2$. Each membrane in the plurality of membranes may have a mass per area of from $2.5 \text{ g/m}^2$ to $60 \text{ g/m}^2$. Each membrane in the plurality of membranes may have a mass per area of from $2.5 \text{ g/m}^2$ to $55 \text{ g/m}^2$. Each membrane in the plurality of membranes may have a mass per area of from $2.5 \text{ g/m}^2$ to $50 \text{ g/m}^2$. Each membrane in the plurality of membranes may have a mass per area of from $2.5 \text{ g/m}^2$ to $45 \text{ g/m}^2$. Each membrane in the plurality of membranes may have a mass per area of from $2.5 \text{ g/m}^2$ to $40 \text{ g/m}^2$. Each membrane in the plurality of membranes may have a mass per area of from $2.5 \text{ g/m}^2$ to $35 \text{ g/m}^2$. Each membrane in the plurality of membranes may have a mass per area of from $2.5 \text{ g/m}^2$ to $30 \text{ g/m}^2$. Each membrane in the plurality of membranes may have a mass per area of from $2.5 \text{ g/m}^2$ to $25 \text{ g/m}^2$. Each membrane in the plurality of membranes may have a mass per area of from $3.0 \text{ g/m}^2$ to $100 \text{ g/m}^2$. Each membrane in the plurality of membranes may have a mass per area of from $3.0 \text{ g/m}^2$ to $95 \text{ g/m}^2$. Each membrane in the plurality of membranes may have a mass per area of from $3.0 \text{ g/m}^2$ to $90 \text{ g/m}^2$. Each membrane in the plurality of membranes may have a mass per area of from $3.0 \text{ g/m}^2$ to $85 \text{ g/m}^2$. Each membrane in the plurality of membranes may have a mass per area of from $3.0 \text{ g/m}^2$ to $80 \text{ g/m}^2$. Each membrane in the plurality of membranes may have a mass per area of from $3.0 \text{ g/m}^2$ to $75 \text{ g/m}^2$. Each membrane in the plurality of membranes may have a mass per area of from $3.0 \text{ g/m}^2$ to $70 \text{ g/m}^2$. Each membrane in the plurality of membranes may have a mass per area of from $3.0 \text{ g/m}^2$ to $65 \text{ g/m}^2$. Each membrane in the plurality of membranes may have a mass per area of from $3.0 \text{ g/m}^2$ to $60 \text{ g/m}^2$. Each membrane in the plurality of membranes may have a mass per area of from $3.0 \text{ g/m}^2$ to $55 \text{ g/m}^2$. Each membrane in the plurality of membranes may have a mass per area of from $3.0 \text{ g/m}^2$ to $50 \text{ g/m}^2$. Each membrane in the plurality of membranes may have a mass per area of from $3.0 \text{ g/m}^2$ to $45 \text{ g/m}^2$. Each membrane in the plurality of membranes may have a mass per area of from $3.0 \text{ g/m}^2$ to $40 \text{ g/m}^2$. Each membrane in the plurality of membranes may have a mass per area of from $3.0 \text{ g/m}^2$ to $35 \text{ g/m}^2$. Each membrane in the plurality of membranes may have a mass per area of from $3.0 \text{ g/m}^2$ to $30 \text{ g/m}^2$. Each membrane in the plurality of membranes may have a mass per area of from $30. \text{ g/m}^2$ to $25 \text{ g/m}^2$. Each membrane in the plurality of membranes may have a mass per area of from $3.0 \text{ g/m}^2$ to $20 \text{ g/m}^2$. Each membrane in the plurality of membranes may have a mass per area of from $3.0 \text{ g/m}^2$ to $15 \text{ g/m}^2$. Each membrane in the plurality of membranes may have a mass per area of from $2 \text{ g/m}^2$ to $20 \text{ g/m}^2$. Each membrane in the plurality of membranes may have a mass per area of from $2 \text{ g/m}^2$ to $15 \text{ g/m}^2$. Each membrane in the plurality of membranes may have a mass per area of from $2 \text{ g/m}^2$ to $10 \text{ g/m}^2$.

Each membrane in the membrane stack may have an isopropyl alcohol (IPA) rating of less than 30% IPA/water. Each membrane in the membrane stack may have an isopropyl alcohol (IPA) rating of less than 25% IPA/water. Each membrane in the membrane stack may have an isopropyl alcohol (IPA) rating of less than 20% IPA/water. Each membrane in the membrane stack may have an isopropyl alcohol (IPA) rating of less than 15% IPA/water. Each membrane in the membrane stack may have an isopropyl alcohol (IPA) rating of less than 10% IPA/water. Each membrane in the membrane stack may have an isopropyl alcohol (IPA) rating of from 1% to 29% IPA/water. Each membrane in the membrane stack may have an isopropyl alcohol (IPA) rating of from 1% to 27% IPA/water. Each membrane in the membrane stack may have an isopropyl alcohol (IPA) rating of from 1% to 25% IPA/water. Each membrane in the membrane stack may have an isopropyl alcohol (IPA) rating of from 1% to 20% IPA/water. Each membrane in the membrane stack may have an isopropyl alcohol (IPA) rating of from 1% to 15% IPA/water. Each membrane in the membrane stack may have an isopropyl alcohol (IPA) rating of from 5% to 29% IPA/water. Each membrane in the membrane stack may have an isopropyl alcohol (IPA) rating of from 10% to 29% IPA/water.

Each membrane may comprise the same non-fluoropolymer such that all membranes of the plurality of membranes comprise the same non-fluoropolymer. One or more of the membranes in the plurality of membranes may comprise a different non-fluoropolymer to the other membranes of the plurality of membranes. Each membrane in the plurality of membranes may comprise a different non-fluoropolymer.

The non-fluoropolymer may be a fibrillated material. Accordingly, the non-fluoropolymer may have a microstructure comprising nodes interconnected by fibrils. The non-fluoropolymer may have a microstructure comprising predominantly fibrils. The non-fluoropolymer may be a fibrillated material.

The non-fluoropolymer may have a microstructure comprising fibers, bundles of fibers, and a plurality of membrane pores, where the fibers and bundles of fibers are interconnected, and the plurality of membrane pores are void spaces between the fibers and bundles of fibers. The non-fluoropolymer may be an electrospun, melt-blown or rotary jet spun polymer membrane.

The non-fluoropolymer of each membrane in the membrane stack may comprise polyethylene (PE), polyurethane (PU), polyamide (PA), or polyimide (PI).

Each membrane in the plurality of membranes may individually comprise polyethylene (PE), polyurethane (PU), polyamide (PA), or polyimide (PI). Each membrane in the plurality of membranes may individually comprise PE or PU.

Each membrane in the plurality of membranes may comprise expanded PE.

Each membrane in the plurality of membranes may comprise PU.

The plurality of membranes may comprise two membranes or more. The plurality of membranes may comprise three membranes or more. The plurality of membranes may comprise four membranes or more.

In some embodiments, the plurality of membranes comprises a first membrane, a second membrane and a third membrane. The second membrane may be positioned between the first membrane and the third membrane. The membrane stack may comprise a first air gap positioned between the first membrane and the second membrane, and a second air gap positioned between the second membrane and the third membrane.

In some embodiments, the first membrane comprises polyethylene or polyimide, the second membrane comprises polyethylene or polyimide and the third membrane comprises polyethylene.

The membrane stack may comprise an adhesive layer between adjacent membranes. The membrane stack may comprise an adhesive layer between at least the first membrane and the second membrane in the membrane stack. The membrane stack may comprise an adhesive layer between adjacent membranes in the membrane stack. The membrane stack may comprise an adhesive layer between each pair of adjacent membranes in the membrane stack.

The or each adhesive layer may define an adhesive layer aperture and each membrane in the plurality of membranes may occlude the adhesive layer aperture.

In embodiments where the membrane stack comprises a first membrane, a second membrane and a third membrane, the membrane stack may comprise a first adhesive layer between the first membrane and the second membrane and a second adhesive layer between the second membrane and the third membrane.

The adhesive of the or each adhesive layer may comprise a heat activated film (HAF). The adhesive of the or each adhesive layer may comprise a pressure sensitive adhesive (PSA). The adhesive of the or each adhesive layer may comprise an ultraviolet curable adhesive.

The adhesive layer may comprise an acrylic adhesive, or a silicone adhesive.

The vent assembly may have a change or reduction of airflow through the vent assembly of less than 80% after a water challenge as described in the method provided herein. The water challenge is a water entry pressure water challenge and is defined in the test method defined herein. Accordingly, the impact of a water challenge on the airflow through the vent assembly may minimised. For the avoidance of doubt, the change in airflow through the vent assembly is calculated as:

$$\Delta\text{Airflow}=((a_p/a_i)-1)\Delta100$$

where $a_p$ is the airflow after the challenge and $a_i$ is the airflow before the challenge.

The vent assembly may have a change in airflow through the vent assembly of less than 80% reduction after a water challenge as described in the methods provided herein. The vent assembly may have a change in airflow through the vent assembly of less than 75% reduction after a water challenge as described in the method provided herein. The vent assembly may have a change in airflow through the vent assembly of less than 70% reduction after a water challenge as described in the methods provided herein. The vent assembly may have a change in airflow through the vent assembly of less than 65% reduction after a water challenge as described in the methods provided herein. The vent assembly may have a change in airflow through the vent assembly of less than 60% reduction after a water challenge as described in the methods provided herein. The vent assembly may have a change in airflow through the vent assembly of less than 55% reduction after a water challenge as described in the methods provided herein. The vent assembly may have a change in airflow through the vent assembly of less than 60%. The vent assembly may have a change in airflow through the vent assembly of less than 50% reduction after a water challenge as described in the method provided herein. The vent assembly may have a change in airflow through the vent assembly of less than 25% reduction after a water challenge as described in the method provided herein.

The vent assembly of the present disclosure may provide an improvement in airflow retention after the water challenge (i.e, a reduced loss of airflow) when the comparison is made between a single layer vent assembly, a two-layer vent assembly and a three-layer vent assembly.

The vent assembly may have a change in airflow through the vent assembly of from 0% to 79% reduction after a water challenge as described in the method provided herein. The vent assembly may have a change in airflow through the vent assembly of from 0% to 74% reduction after a water challenge as described in the method provided herein. The vent assembly may have a change in airflow through the vent assembly of from 0% to 49% reduction after a water challenge as described in the method provided herein. The vent assembly may have a change in airflow through the vent assembly of from 0% to 24% reduction after a water challenge as described in the method provided herein.

The vent assembly may have a change in water entry pressure (WEP) of less than 80% reduction after a contamination challenge as described in the method provided herein. The contamination challenge in the test method described below is a soap immersion challenge where the vent assembly is immersed in a surfactant aqueous solution. For the avoidance on doubt, the change in WEP through the vent assembly is calculated as:

$$\Delta WEP = \left( \left( WEP_p / WEP_i \right) - 1 \right) \times 100$$

where $WEP_p$ is the measured water entry pressure after the challenge and $WEP_i$ is the measured water entry pressure before the challenge.

The vent assembly may have a change in water entry pressure (WEP) of less than 70% reduction after a contamination challenge. The vent assembly may have a change in WEP of less than 60% reduction after a contamination challenge. The vent assembly may have a change in WEP of less than 50% reduction after a contamination challenge. The vent assembly may have a change in WEP of less than 40% reduction after a contamination challenge.

The airflow through the vent assembly may be at least 0.05 L/hr as measured using the method described herein. The airflow through the vent assembly may be at least 0.1 L/hr as measured using the method described herein. The airflow through the vent assembly may be at least 0.15 L/hr as measured using the method described herein. The airflow through the vent assembly may be at least 0.2 L/hr as measured using the method described herein. The airflow through the vent assembly may be from 0.05 L/hr to 100 L/hr. The airflow through the vent assembly may be from 0.05 L/hr to 95 L/hr. The airflow through the vent assembly may be from 0.05 L/hr to 90 L/hr. The airflow through the vent assembly may be from 0.05 L/hr to 85 L/hr. The airflow through the vent assembly may be from 0.05 L/hr to 80 L/hr. The airflow through the vent assembly may be from 0.05 L/hr to 75 L/hr. The airflow through the vent assembly may be from 0.05 L/hr to 70 L/hr. The airflow through the vent assembly may be from 0.05 L/hr to 65 L/hr. The airflow through the vent assembly may be from 0.05 L/hr to 60 L/hr. The airflow through the vent assembly may be from 0.05 L/hr to 55 L/hr. The airflow through the vent assembly may be from 0.05 L/hr to 50 L/hr. The airflow through the vent assembly may be from 0.05 L/hr to 45 L/hr. The airflow through the vent assembly may be from 0.05 L/hr to 40 L/hr. The airflow through the vent assembly may be from 0.05 L/hr to 35 L/hr. The airflow through the vent assembly may be from 0.05 L/hr to 30 L/hr. The airflow through the vent assembly may be from 0.05 L/hr to 25 L/hr. The airflow through the vent assembly may be from 0.05 L/hr to 20 L/hr. The airflow through the vent assembly may be from 0.05 L/hr to 15 L/hr. The airflow through the vent assembly may be from 0.05 L/hr to 10 L/hr. The airflow through the vent assembly may be from 0.1 L/hr to 10 L/hr. The airflow through the vent assembly may be from 0.15 L/hr to 10 L/hr. The airflow through the vent assembly may be from 0.2 L/hr to 10 L/hr. The airflow through the vent assembly may be from 0.05 L/hr to 8 L/hr. The airflow through the vent assembly may be from 0.05 L/hr to 6 L/hr. The airflow through the vent assembly may be from 0.05 L/hr to 4 L/hr. The airflow through the vent assembly may be from 0.05 L/hr to 2 L/hr.

The plurality of membranes may comprise a first membrane, a second membrane and a third membrane and a first air gap is provided between the first membrane and the second membrane and a second air gap is provided between the second membrane and the third membrane. The first membrane, the second membrane and the third membrane may each individually comprise PE or PU.

Typically, each membrane in the plurality of membranes does not comprise a coating.

In some embodiments, each membrane in the plurality of membranes may comprise the same material.

At least one membrane of the plurality of membranes may have a bubble point of at least 0.2 bar as measured using the test method provided herein. At least one membrane of the plurality of membranes may have a bubble point of at least 0.5 bar as measured using the test method provided herein. At least one membrane of the plurality of membranes may have a bubble point of at least 1.0 bar as measured using the test method provided herein. At least one membrane of the plurality of membranes may have a bubble point of at least 1.5 bar as measured using the test method provided herein. At least one membrane of the plurality of membranes may have a bubble point of at least 2 bar as measured using the test method provided herein.

In embodiments comprising a first membrane, a second membrane and a third membrane, at least one of the first membrane, the second membrane and the third membrane may have a bubble point of at least 2 bar as measured using the test method provided herein.

At least one membrane of the plurality of membranes may have a bubble point of at least 2.5 bar. At least one membrane of the plurality of membranes may have a bubble point of at least 3 bar. At least one membrane of the plurality of membranes may have a bubble point of at least 3.5 bar. At least one membrane of the plurality of membranes may have a bubble point of at least 4 bar.

At least one membrane of the plurality of membranes may have a bubble point of from 0.2 bar to 10 bar. At least one membrane of the plurality of membranes may have a bubble point of from 0.5 bar to 10 bar. At least one membrane of the plurality of membranes may have a bubble point of from 1.0 bar to 10 bar. At least one membrane of the plurality of membranes may have a bubble point of from 1.5 bar to 10 bar. At least one membrane of the plurality of membranes may have a bubble point of from 2 bar to 10 bar. At least one membrane of the plurality of membranes may have a bubble point of from 0.2 bar to 8 bar. At least one membrane of the plurality of membranes may have a bubble point of from 0.2 bar to 6 bar. At least one membrane of the plurality of membranes may have a bubble point of from 0.2 bar to 5 bar.

The plurality of membranes may comprise a final membrane. The final membrane may be on the side of the membrane stack opposed to the first membrane. For example, in embodiments comprising three membranes, the final membrane is the third membrane.

The final membrane may have a bubble point of at least 2 bar. The final membrane may have a bubble point of at least 2.5 bar. The final membrane may have a bubble point of at least 3 bar. The final membrane may have a bubble point of at least 3.5 bar. The final membrane may have a bubble point of at least 4 bar.

In a second aspect there is provided a device comprising a device housing. The device housing defines an aperture and the aperture is occluded by a vent assembly according to the first aspect. The vent assembly may be positioned over the aperture.

The device may be an electronic device.

The electronic device may comprise an acoustic transducer. The acoustic transducer may comprise a speaker or a microphone. The acoustic transducer may be positioned adjacent to the vent assembly such that any contaminant must pass through the vent assembly before contacting the acoustic transducer.

BRIEF DESCRIPTION OF THE FIGURES

Embodiments of the present invention will now be described, by way of non-limiting example, with reference to the accompanying drawings.

DETAILED DESCRIPTION

Figure 1:
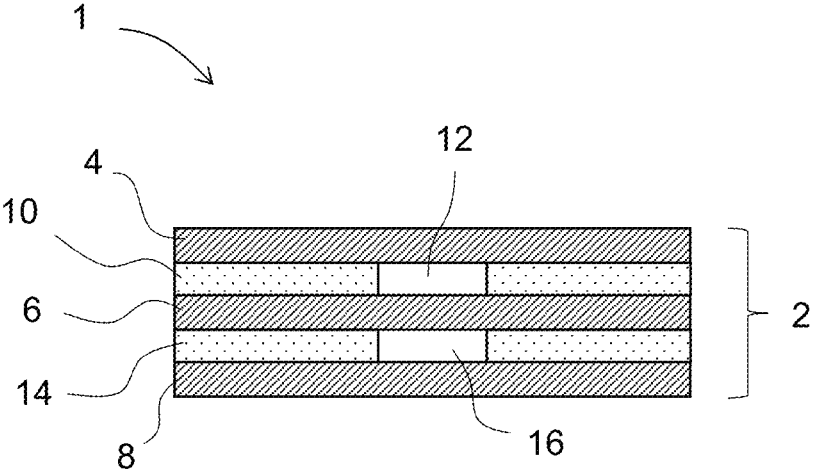
FIG. 1 is a schematic side cross-sectional view of a vent assembly according to an embodiment.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

Test Methods

Mass Per Area

Samples were die cut to form circular sections of 5.64 cm radius (area=100 cm²). Each sample was weighed using a Mettler Toledo ME104TE Analytical balance and the average of six samples was divided by the test area of 100 cm² and multiplied by 100 to calculate the mass per area in units of g/m².

Non-Contact Thickness

The non-contact thickness of the membranes was measured using a KEYENCE LS-7600 laser system (commercially available from KEYENCE America). The optical measurement is made by gently placing the sample membrane against a polished stainless cylinder having a 2.54 cm diameter and smoothing it down with minimal applied tension. The thickness of the sample is determined by measurement of the shadow created in the parallel light path of within the two ends of the Keyence laser micrometer. The average of the three measurements was utilized to provide a mean non-contact thickness.

Water Entry Pressure (WEP) Test

Initial Test

The water entry pressure (WEP) test is applied to a vent assembly and the vent assembly is clamped and sealed in a sample holder. Water pressure is applied to one side and the pressure was ramped up in small increments from 0-90 psi over a period of 50 minutes. If water does not intrude through the vent assembly to be visible on the opposite side during the specified duration, the sample is deemed to have passed the WEP test. After the test duration, the sample can be disassembled and it can be determined whether water has passed through each membrane or none of the above.

Post Contamination

Samples are immersed at a depth of 10 cm in a 0.1% solution of a surfactant composition by weight in deionized water for a period of 10 minutes. The surfactant composition comprises 7-13% total anionic surfactant (sodium laureth sulfate and sodium lauryl sulfate) and 1-5% alkyl dimethyl amine oxide and was sourced from The Proctor & Gamble Company under the product name "Ivory Liquid Hand Dishwashing Detergents Product-Ultra Ivory Classic Scent". This process is repeated for 3 cycles and then the samples are dried in an oven at 50° C. for 1 hour.

THE WEP for the samples was then measured using the procedure described above.

Bubble Point Test

The bubble point was measured according to the general teachings of ASTM F316-03 using a Capillary Flow Porometer (Model 3 G zh from Quantachrome Instruments). The sample holder comprised a porous metal plate (Part Number: 196450, Anton Paar), 25.4 mm in diameter and a plastic mask (Part Number ABF-300, Professional Plastics), 18 mm inner diameter×24.5 mm outer diameter. The sample was placed in between the metal plate and the plastic mask. The sample was then clamped down and sealed using an O-ring (Part Number: 193798, Anton Paar). The sample was wet with the test fluid (Silicone fluid, 10 cSt, having a surface tension of 19.75 dynes/cm). The porous metal plate was covered with 2-3 mm of the test fluid and the pressure of gas (filtered air) applied to the side of the sample opposed to the test fluid was increased slowly. The lowest pressure at which a steady stream of bubbles rise from the central area of the test fluid is recorded as the bubble point.

Airflow Measurement (for Membranes)

The airflow test measures laminar volumetric flow rates of air through membrane samples. Each membrane sample was clamped between two plates in a manner that seals an area of 2.99 cm² across the flow pathway. An ATEQ® (ATEQ Corp., Livonia, MI) Premier D Compact Flow Tester was used to measure airflow rate (L/hr) through each membrane sample by challenging it with a differential air pressure of 1.2 kPa (12 mbar) through the membrane.

Airflow Measurement (for Vent Assemblies)

Initial

This defines a test method for measuring laminar volumetric flow rates of air through acoustic vent assembly samples. The sample assembly is clamped between two plates in a manner that only applies compression to the FR4 coupons and seals against the surfaces with an O-ring. An ATEQ Premier D Compact Flow Tester is used to measure airflow rate (mL/min) through the vent assembly by challenging it with 7 kPa of air pressure through the orifice in the steel plate.

Post Contamination

Samples are immersed at a depth of 10 cm in a 0.1% solution of a surfactant composition by weight in deionized water for a period of 10 minutes. The surfactant composition comprises 7-13% total anionic surfactant (sodium laureth sulfate and sodium lauryl sulfate) and 1-5% alkyl dimethyl amine oxide and was sourced from The Proctor & Gamble Company under the product name "Ivory Liquid Hand Dishwashing Detergents Product-Ultra Ivory Classic Scent". This process is repeated for 3 cycles and then the samples are dried in an oven at 50° C. for 1 hour.

The airflow for the samples was then measured using the procedure described above.

IPA Rating TEST

The resistance to wetting or the degree of contamination resistance is measured using an isopropyl alcohol (IPA) wetting rating test. In this test drops of solution of different ratios of IPA to water (starting at 0% and increasing in 5% intervals) are placed on the substrate and viewed for about 30 seconds for wetting as indicated by clarification of the substrate. Fully wet-out areas become translucent to transparent. This indicates that the test fluid has entered sample pores. Samples that retain the original opacity have not wet-out. A higher percent IPA solution indicates a higher degree of contamination resistance. Accordingly, an IPA rating of 30% corresponds to a material that does not wet fully with an IPA solution having 30% IPA but did wet at a higher IPA %, such as 35%, for example.

GENERAL EXAMPLES

Example 1

Figure 2:
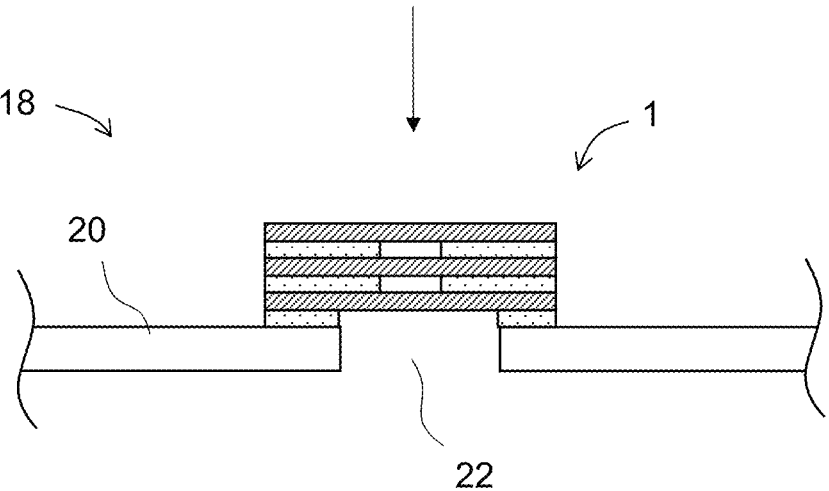
FIG. 2 is a schematic side cross-sectional view of a device according to an embodiment comprising the vent assembly of FIG. 1.

With reference to FIGS. 1 and 2, there is a provided a vent assembly 1 comprising a membrane stack 2. The membrane stack 2 comprises a first membrane 4, a second membrane 6 and a third membrane 8. The first membrane 4, the second membrane 6 and the third membrane 8 completely overlap and occlude one another. The first membrane 4 comprises an expanded polyethylene (ePE) membrane. The second membrane 6 comprises an ePE membrane. The third membrane 8 comprises an ePE membrane.

A first adhesive layer 10 comprising a heat activated film (HAF) is provided between the first membrane 4 and the second membrane 6 that adheres the first membrane 4 to the second membrane 6. The first adhesive layer 10 defines a first aperture 12 (acting as a first air gap) and the first membrane 4 and the second membrane 6 occlude the first aperture 12. The first aperture 12 separates the first membrane 4 from the second membrane 6 by 30 µm.

A second adhesive layer 14 comprising a heat activated film (HAF) is provided between the second membrane 6 and the third membrane 8 that adheres the second membrane 6 to the third membrane 8. The second adhesive layer 14 defines a second aperture 16 (acting as a second air gap) and the second membrane 6 and the third membrane 8 occlude the second aperture 16. The second aperture 16 separates the second membrane 6 from the third membrane 8 by 30 µm.

FIG. 2 shows the vent assembly 1 installed in a device 18. The device 18 comprises a device housing 20 and the device housing 20 defines an aperture 22. The vent assembly 1 is adhered to the device housing 20 around the aperture 22 and fully occludes the aperture 22.

The vent assembly 1 is oriented such that the third membrane 4 directly faces the aperture 22. Accordingly, any contaminant such as particulates or liquids must initially pass through the first membrane 4 in order to pass through the vent assembly 1 and then into the interior of the device housing 20 (see arrow 24 showing direction of contaminant challenge).

Example 2

Figure 3:
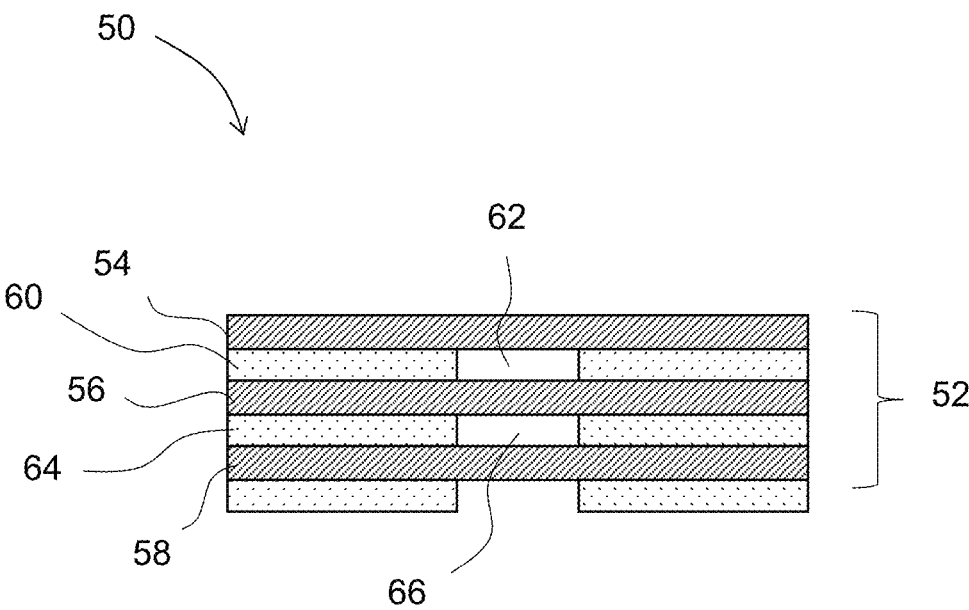
FIG. 3 is a schematic side cross-sectional view of a vent assembly according to an embodiment.
Figure 4:
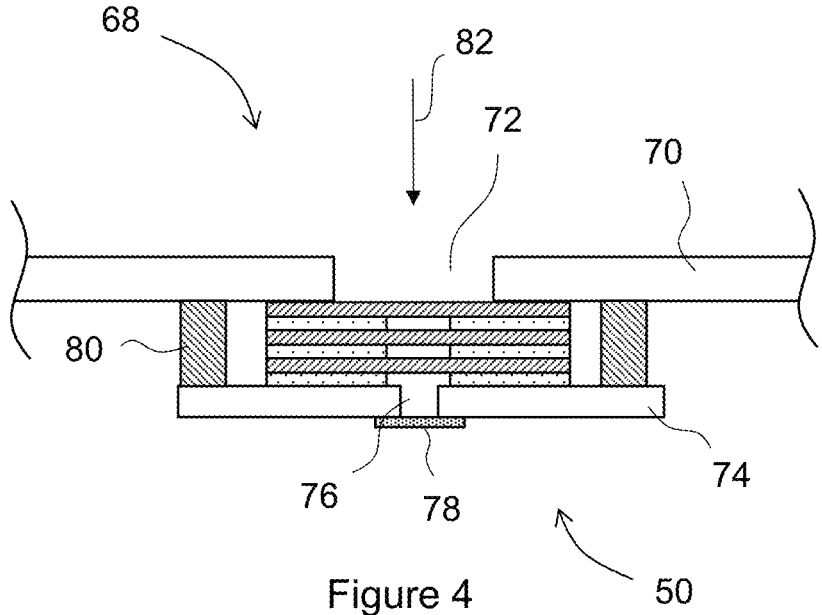
FIG. 4 is a schematic side cross-sectional view of an electronic device according to an embodiment comprising the vent assembly of FIG. 3.

With reference to FIGS. 3 and 4, there is a provided a vent assembly 50 comprising a membrane stack 52. The membrane stack 52 comprises a first membrane 54, a second membrane 56 and a third membrane 58. The first membrane 54, the second membrane 56 and the third membrane 58 completely overlap and occlude one another. The first membrane 54 comprises a polyurethane (PU) membrane. The second membrane 56 comprises a PU membrane. The third membrane 58 comprises a PU membrane.

A first adhesive layer 60 comprising a heat activated film (HAF) is provided between the first membrane 54 and the second membrane 56 that adheres the first membrane 54 to the second membrane 56. The first adhesive layer 60 defines a first aperture 62 (acting as a first air gap) and the first membrane 54 and the second membrane 56 occlude the first aperture 62. The first aperture 62 separates the first membrane 54 from the second membrane 56 by 25 µm.

A second adhesive layer 64 comprising a heat activated film (HAF) is provided between the second membrane 56 and the third membrane 58 that adheres the second membrane 56 to the third membrane 58. The second adhesive layer 64 defines a second aperture 66 (acting as a second air gap) and the second membrane 56 and the third membrane 58 occlude the second aperture 66. The second aperture 66 separates the second membrane 56 from the third membrane 58 by 25 µm.

FIG. 4 shows the vent assembly 50 installed in an electronic device 68. The electronic device 68 comprises a housing 70 and the housing 70 defines an aperture 72. The vent assembly 50 is adhered to a substrate 74 and the first membrane 54 directly abuts the housing 70 around the aperture 72 and fully occludes the aperture 72. The substrate 74 defines an acoustic aperture 76 and a speaker 78 is provided directly beneath the acoustic aperture 76. A containment wall 80 is provided between the substrate 74 and the housing 70 to contain the vent assembly 50 therein. The vent assembly 50 is oriented such that the first membrane 54 directly faces the aperture 72. Accordingly, any contaminant such as particulates or liquids must initially pass through the first membrane 54 in order to pass through the vent assembly 50 and then into the interior of the housing 70 (see arrow 82 showing direction of contaminant challenge).

Example 3

Figure 5:
FIG. 5 is a schematic side cross-sectional view of a vent assembly according to an embodiment.
Figure 5:
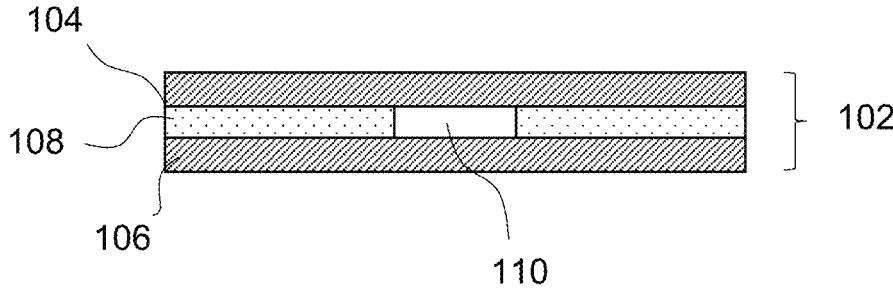
Figure 6:
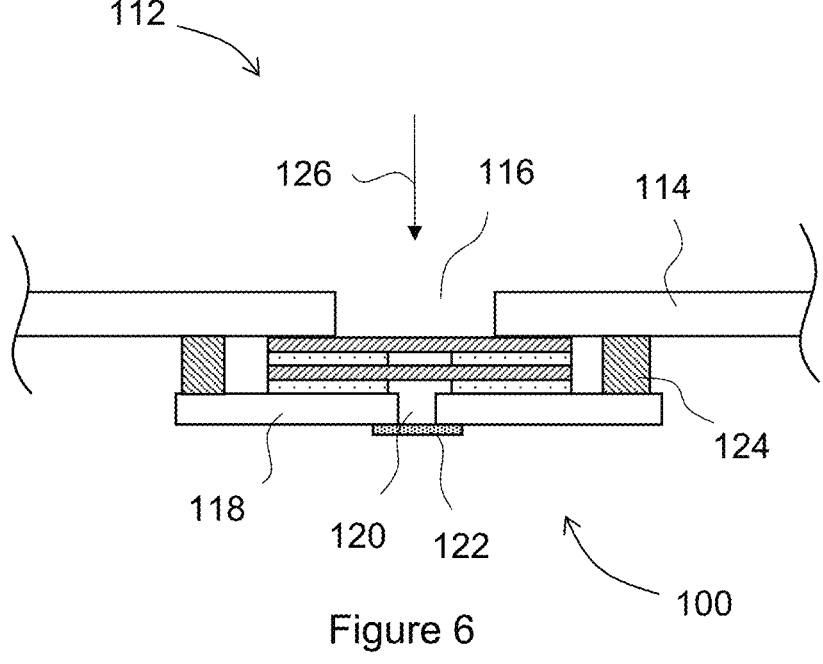
FIG. 6 is a schematic side cross-sectional view of an electronic device according to an embodiment comprising the vent assembly of FIG. 5.

With reference to FIGS. 5 and 6, there is a provided a vent assembly 100 comprising a membrane stack 102. The membrane stack 102 comprises a first membrane 104, and a second membrane 106. The first membrane 104 and the second membrane 106 completely overlap and occlude one another. The first membrane 104 comprises an ePE membrane. The second membrane 106 comprises an ePE membrane.

An adhesive layer 108 comprising a pressure sensitive adhesive (PSA) is provided between the first membrane 104 and the second membrane 106 that adheres the first membrane 104 to the second membrane 106. The adhesive layer 108 defines an aperture 110 (acting as an air gap) and the first membrane 104 and the second membrane 106 occlude the aperture 110. The aperture 110 separates the first membrane 104 from the second membrane 106 by 35 μm.

FIG. 6 shows the vent assembly 100 installed in an electronic device 112. The electronic device 112 comprises a housing 114 and the housing 114 defines an aperture 116. The vent assembly 100 is adhered to a substrate 118 and the first membrane 104 directly abuts the housing 114 around the aperture 116 and fully occludes the aperture 116. The substrate 118 defines an acoustic aperture 120 and a microphone 122 is provided directly beneath the acoustic aperture 120. A containment wall 124 is provided between the substrate 118 and the housing 114 to contain the vent assembly 100 therein. The vent assembly 100 is oriented such that the first membrane 104 directly faces the aperture 116. Accordingly, and contaminant such as particulates or liquids must initially pass through the first membrane 104 in order to pass through the vent assembly 100 and then into the interior of the housing 114 (see arrow 126 showing direction of contaminant challenge).

SPECIFIC EXAMPLES

Materials
Expanded Polytetrafluoroethylene (ePTFE)

An ePTFE membrane was made according to the processes disclosed in Gore's U.S. Pat. No. 3,935,566. The membrane has a mass per area of 7.4 g/m², thickness of 15 μm, a bubble point 52.8 psi (3.6 bar), an airflow of 5.4 L/hr/cm² @12 mbar, and an IPA rating 40%.
ePTFE (Oleophobic)

The ePTFE membrane described above as "ePTFE", made according to the processes disclosed in Gore's U.S. Pat. No. 3,935,566, was coated with perfluoroalkyl acrylate as taught in U.S. Pat. No. 5,462,586 to render it oleophobic. The resulting membrane has a mass per area of 8.1 g/m², a thickness of 10.8 μm, a bubble point of 40.3 psi (2.8 bar), an airflow of 3.8 L/hr/cm² @12 mbar, and an IPA rating of 80%.
Expanded Polyethylene (ePE)

A starting resin polyethylene having a weighted average molecular weight of 2,100,000 g/mol, was used in accordance with the method disclosed in U.S. Pat. No. 8,465,565 to manufacture a precursor film as a tape.

The approximate tape width and thickness was 0.3 m and 0.3 mm, respectively. The dried film was drawn in the longitudinal/machine direction between multiple sets of banks of rolls in an oven set at an approximate temperature of 130° C. The speed ratio was set between each successive bank of rolls relative to the first bank resulting in a total machine direction expansion ratio of 10:1 with an average strain rate of 3.2%/s.

The longitudinally drawn membrane was then heated in a transverse expansion oven set at an approximate temperature of 145° C. and drawn transversely to a ratio of 10:1 at a strain rate of 2.1%/s. Then, the membrane was allowed to relax approximately 1% in the transverse direction while clamped before exiting the oven.

The resultant membrane had the following properties: Mass per area is 4.0 g/m², 31.0 μm thickness, bubble point 50.1 psi (3.5 bar), airflow 3.8 L/hr/cm² @12 mbar, IPA rating 10%.
Polyurethane (PU1)

A polyurethane membrane was sourced from the company Elmarco, under part number EKO-5 and that the following properties: Mass per area is 3.8 g/m², 19.8 μm thickness, bubble point 7.7 psi (0.5 bar), airflow 34.7 L/hr/cm² @12 mbar, IPA rating 10%.
Polyurethane (PU2)

A polyurethane membrane was sourced from the company Elmarco under part number EKO-10 and that the following properties: Mass per area is 9.4 g/m², 34.3 μm thickness, bubble point 7.3 psi (0.5 bar), airflow 28.2 L/hr/cm² @12 mbar, IPA rating 25%.

Example 4

A comparative vent assembly comprises a single layer of "ePTFE" membrane as described above.

Example 5

A comparative vent assembly comprises a single layer of "ePTFE (Oleophobic)" membrane as described above.

Example 6

An example vent assembly comprises a first membrane, a second membrane and a third membrane. The first membrane, the second membrane and the third membrane comprised the ePE membrane as described above. An acrylic adhesive layer (Part number 5603R from Nitto Denko Corporation) is provided between the first membrane and the second membrane and a further acrylic adhesive layer (Part number 5603R from Nitto Denko Corporation) is provided between the second membrane and the third membrane. An air gap of 30 μm is defined between the first membrane and the second membrane and between the second membrane and the third membrane.

Example 7

An example vent assembly comprises a first membrane and a second membrane. The first membrane and the second membrane comprised the ePE membrane as described above. An acrylic adhesive layer (Part number 5603R from Nitto Denko Corporation) is provided between the first membrane and the second membrane. An air gap of 30 μm is defined between the first membrane and the second membrane.

Example 8

A comparative vent assembly comprises a single ePE membrane as described above.

Example 9

An example vent assembly comprises a first membrane, a second membrane and a third membrane. The first membrane, the second membrane and the third membrane comprised the polyurethane (PU1) membrane as described above. An acrylic adhesive layer (Part number 5603R from Nitto Denko Corporation) is provided between the first membrane and the second membrane and a further acrylic adhesive layer (Part number 5603R from Nitto Denko Corporation) is provided between the second membrane and the third membrane. An air gap of 30 μm is defined between the first membrane and the second membrane and between the second membrane and the third membrane.

Example 10

A comparative vent assembly comprises a single PU1 membrane as described above.

Example 11

An example vent assembly comprises a first membrane, a second membrane and a third membrane. The first membrane, the second membrane and the third membrane comprised the polyurethane (PU2) membrane as described above. An acrylic adhesive layer (Part number 5603R from Nitto Denko Corporation) is provided between the first membrane and the second membrane and a further acrylic adhesive layer (Part number 5603R from Nitto Denko Corporation) is provided between the second membrane and the third membrane. An air gap of 30 μm is defined between the first membrane and the second membrane and between the second membrane and the third membrane.

Example 12

An example vent assembly comprises a first membrane and a second membrane. The first membrane and the second membrane comprised the PU2 membrane as described above. An acrylic adhesive layer (Part number 5603R from Nitto Denko Corporation) is provided between the first membrane and the second membrane. An air gap of 30 μm is defined between the first membrane and the second membrane.

Example 13

A comparative vent assembly comprises a single PU2 membrane as described above.

The iWEP and Airflow of each example vent assembly were measured using the test methods provided above with the first membrane as defined in Table 1 below being the membrane in the membrane stacks of the vent assemblies facing the challenge (either water or air). The results of these tests are shown in Table 1 below.

Figure 7:
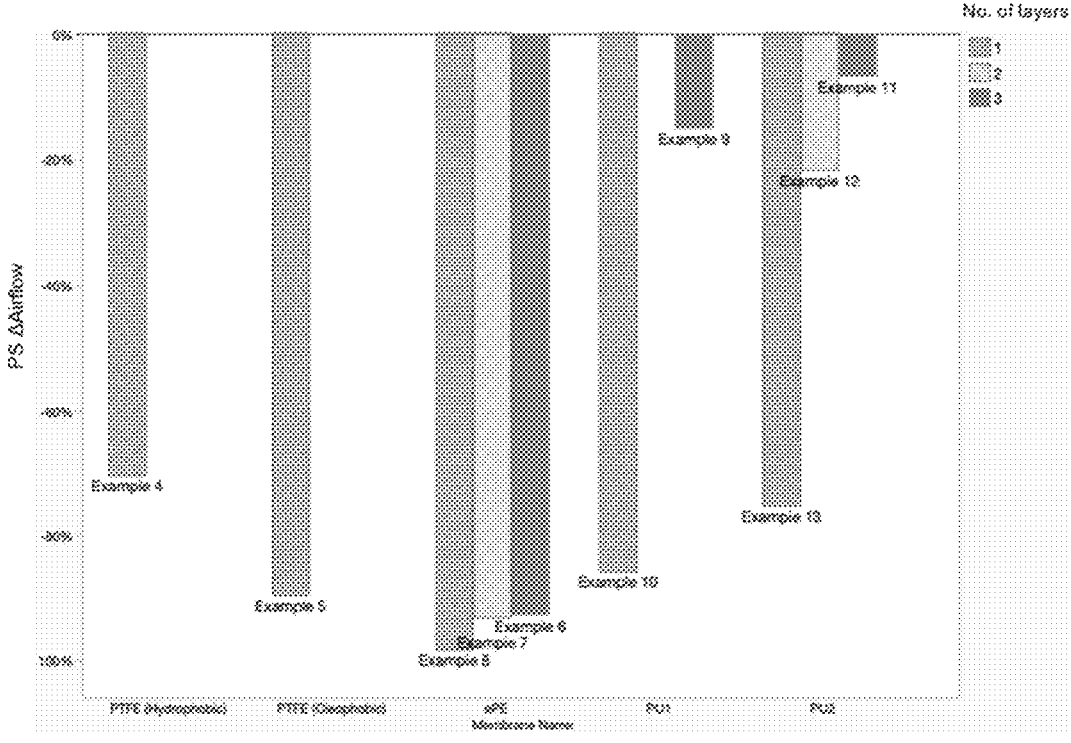
FIG. 7 is a plot of change in airflow after the contamination challenge for membranes according to the comparative examples and examples.
Figure 8:
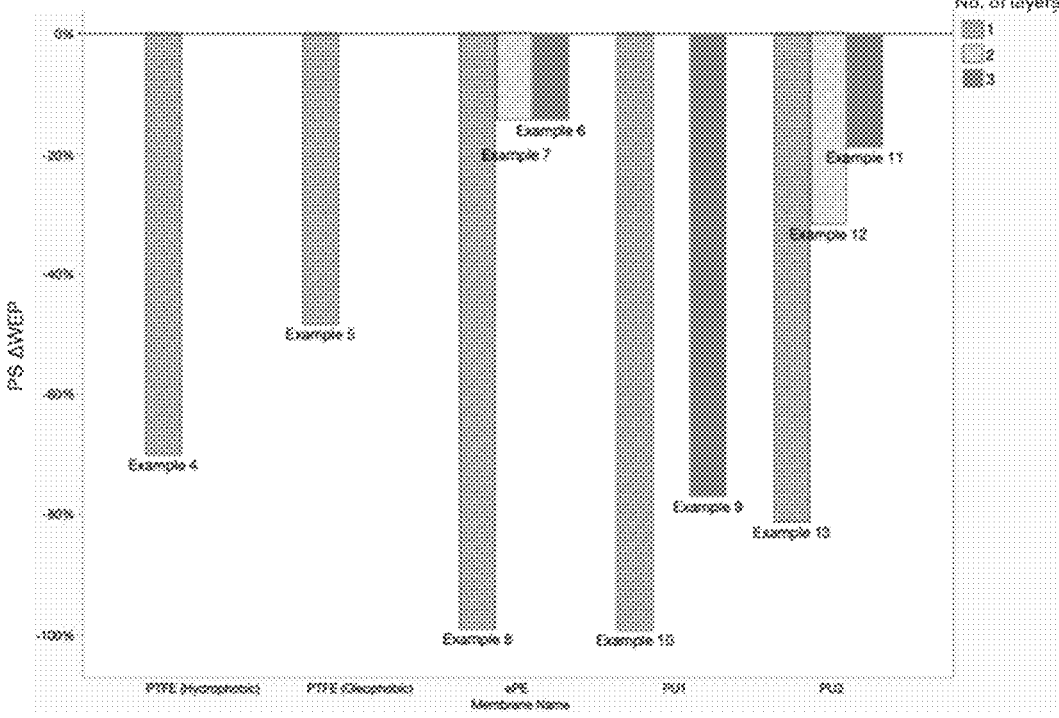
FIG. 8 is a plot of change in water entry pressure after the contamination challenge for membranes according to the comparative examples and examples.
Figure 9:
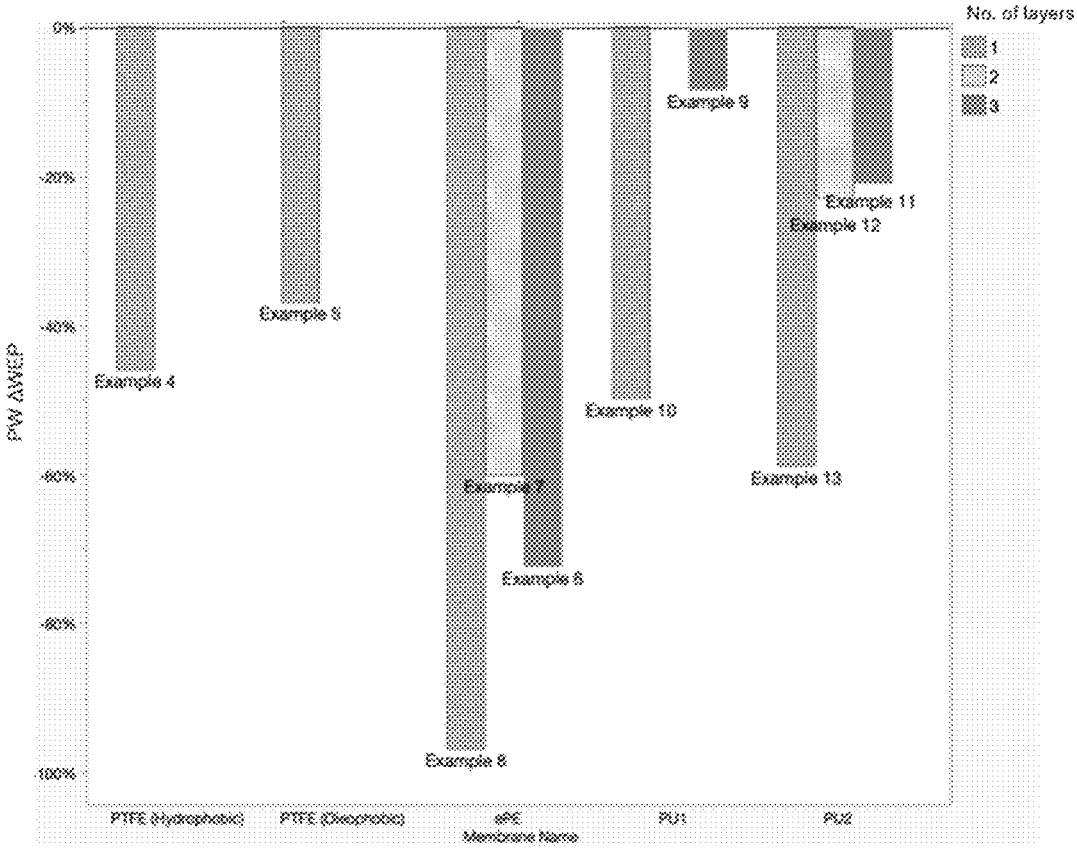
FIG. 9 is a plot of change in water entry pressure after the water challenge for membranes according to the comparative examples and examples.

ΔWEP) performance after contamination (soap) challenge, as shown in Table 1 and FIGS. 7, 8 and 9.

In contrast, vent assemblies having multiple non-fluoropolymer membranes (examples 6, 7, 9, 11, and 12) show at least comparative performance to the PTFE vent assemblies if not significantly improved performance, as shown in Table 1 and FIGS. 7, 8, and 9.

FIG. 7 also highlights that the loss of airflow after the contamination challenge is less for the multilayer vent assemblies (examples 6, 7, 9, 11, and 12) compared to a vent assembly comprising a single layer of corresponding material (examples 8, 10, and 13) Therefore, the multilayer vent assemblies have improved post contamination airflow retention compared to the single layer examples.

FIG. 8 highlights that the change in water entry pressure after the contamination challenge is less for the multilayer vent assemblies (examples 6, 7, 9, 11, and 12) compared to a vent assembly comprising a single layer of corresponding material (examples 8, 10, and 13) Therefore, the multilayer vent assemblies have improved post contamination resistance to water ingress compared to the single layer examples.

FIG. 9 highlights that the loss of airflow after the water challenge is less for the multilayer vent assemblies (examples 6, 7, 9, 11, and 12) compared to a vent assembly comprising a single layer of corresponding material (examples 8, 10, and 13) Therefore, the multilayer vent assemblies have improved post water challenge airflow retention compared to the single layer examples.

While there has been hereinbefore described approved embodiments of the present invention, it will be readily apparent that many and various changes and modifications in form, design, structure and arrangement of parts may be made for other embodiments without departing from the invention and it will be understood that all such changes and modifications are contemplated as embodiments as a part of the present invention as defined in the appended claims.

The invention claimed is:

1. A vent assembly comprising a membrane stack, the membrane stack comprising a plurality of membranes and

TABLE 1

Examples and comparative examples and various properties measured for them.

| Example | Layer 1 | Layer 2 | Layer 3 | Airflow, L/hr | WEP, psi | PS ΔAirflow | PW ΔAirflow | PS ΔWEP |
|---|---|---|---|---|---|---|---|---|
| 4 | PTFE | — | — | 0.93 | 73.8 | −70% | −46% | −70% |
| 5 | PTFE* | — | — | 0.52 | 90.0 | −90% | −37% | −48% |
| 6 | ePE | ePE | ePE | 0.21 | 90.0 | −93% | −72% | −15% |
| 7 | ePE | ePE | — | 0.21 | 78.2 | −93% | −60% | −14% |
| 8 | ePE | — | — | 0.63 | 90.0 | −98% | −97% | −99% |
| 9 | PU1 | PU1 | PU1 | 1.98 | 11.6 | −15% | −8% | −77% |
| 10 | PU1 | — | — | 5.4 | 13.1 | −86% | −50% | −99% |
| 11 | PU2 | PU2 | PU2 | 1.22 | 25.1 | −7% | −21% | −19% |
| 12 | PU2 | PU2 | — | 2.05 | 19.8 | −22% | −23% | −32% |
| 13 | PU2 | — | — | 3.88 | 16.5 | −75% | −59% | −81% |

PS ΔAirflow—Post soap challenge change in airflow.
PW ΔAirflow—Post WEP challenge change in airflow.
PS ΔWEP—Post soap challenge change in WEP failure pressure.
PTFE - ePTFE membrane above
PTFE* - ePTFE (oleophobic) above PTFE and coated PTFE (PTFE*) single layer vent assemblies (examples 4 and 5) show good retention of airflow after a water challenge (PW ΔAirflow) and show significant loss of airflow (PS ΔAirflow) and water entry pressure (PS an air gap between adjacent membranes in the plurality of membranes, wherein each membrane in the plurality of membranes comprises a non-fluoropolymer and substantially occlude each other in the membrane stack, wherein at least one membrane of the plurality of membranes has a bubble point of from 0.2 bar to 10 bar.

2. The vent assembly of claim 1, wherein the thickness of each membrane in the plurality of membranes is at least 5 μm.

3. The vent assembly of claim 1, wherein the thickness of each membrane in the plurality of membranes is from 5 μm to 200 μm.

4. The vent assembly of claim 1, wherein each membrane in the plurality of membranes has a mass per area of at least 2 g/m².

5. The vent assembly of claim 1, wherein each membrane in the plurality of membranes has a mass per area of from 2 g/m² to 100 g/m².

6. The vent assembly of claim 1, wherein each membrane in the membrane stack has an isopropyl alcohol (IPA) rating of less than 30% IPA/water.

7. The vent assembly of claim 1, wherein each membrane in the plurality of membranes individually comprise polyethylene (PE), polyurethane (PU), polyamide (PA), or polyimide (PI).

8. The vent assembly of claim 7, wherein each membrane in the plurality of membranes individually comprise PE or PU.

9. The vent assembly of claim 7, wherein each membrane in the plurality of membranes comprise expanded PE.

10. The vent assembly of claim 7, wherein each membrane in the plurality of membranes comprise PU.

11. The vent assembly of claim 1, wherein the membrane stack comprises an adhesive layer between adjacent membranes.

12. The vent assembly of claim 9, wherein the adhesive layer comprises a heat activated film (HAF) or a pressure sensitive adhesive (PSA).

13. The vent assembly of claim 1, wherein the vent assembly has a change in airflow through the vent assembly of less than 80% reduction after a water challenge.

14. The vent assembly of claim 1, wherein the vent assembly has a change in water entry pressure (WEP) of less than 80% reduction after a contamination challenge.

15. The vent assembly of claim 1, wherein the airflow through the vent assembly is from 0.05 L/hr.

16. The vent assembly of claim 1, wherein the airflow through the vent assembly is from 0.05 L/hr to 100 L/hr.

17. The vent assembly of claim 1, wherein the plurality of membranes comprises a first membrane, a second membrane and a third membrane and a first air gap is provided between the first membrane and the second membrane and a second air gap is provided between the second membrane and the third membrane.

18. The vent assembly of claim 17, wherein the first membrane, the second membrane and the third membrane each individually comprise PE or PU.

19. The vent assembly of claim 1, wherein each membrane in the plurality of membranes does not comprise a coating.

20. The vent assembly of claim 1, wherein the air gap between adjacent membranes is at least 20 μm.

21. The vent assembly of claim 1, wherein, the air gap between the adjacent membranes is from 20 μm to 100 μm.

22. The vent assembly of claim 1, wherein each membrane in the plurality of membranes comprise the same material.

23. A device comprising a vent assembly according to claim 1.

24. The device of claim 23, further comprising a housing defining an aperture and the vent assembly is positioned over the aperture.

* * * * *